United States Patent
Sun et al.

(10) Patent No.: US 9,640,236 B2
(45) Date of Patent: May 2, 2017

(54) REDUCED LOAD MEMORY MODULE USING WIRE BONDS AND A PLURALITY OF RANK SIGNALS

(71) Applicant: Invensas Corporation, San Jose, CA (US)

(72) Inventors: Zhuowen Sun, Campbell, CA (US); Yong Chen, Palo Alto, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/645,811

(22) Filed: Mar. 12, 2015

(65) Prior Publication Data

US 2016/0267954 A1    Sep. 15, 2016

(51) Int. Cl.
| | |
|---|---|
| G11C 8/06 | (2006.01) |
| G11C 5/06 | (2006.01) |
| G11C 8/12 | (2006.01) |
| G06F 12/00 | (2006.01) |
| G11C 5/04 | (2006.01) |

(52) U.S. Cl.
CPC ............... *G11C 8/06* (2013.01); *G06F 12/00* (2013.01); *G11C 5/04* (2013.01); *G11C 5/06* (2013.01); *G11C 8/12* (2013.01)

(58) Field of Classification Search
CPC .... G11C 8/06; G11C 5/02; G11C 8/10; G11C 8/12; G11C 5/06; G06F 12/00
See application file for complete search history.

(56) References Cited

U.S. PATENT DOCUMENTS

| | | | |
|---|---|---|---|
| 8,680,684 B2 | 3/2014 | Haba et al. | |
| 2003/0035312 A1 | 2/2003 | Halbert et al. | |
| 2006/0062047 A1* | 3/2006 | Bhakta | G06F 12/0207 |
| | | | 365/185.09 |
| 2006/0129755 A1* | 6/2006 | Raghuram | G11C 8/12 |
| | | | 711/105 |

(Continued)

FOREIGN PATENT DOCUMENTS

WO    2011/103658 A1    9/2011

OTHER PUBLICATIONS

JEDEC Standard, LRDIMM DDR3 Memory Buffer (MB) Version 1.0, Oct. 2014, JEDEC Solid State Technology Association.*

(Continued)

*Primary Examiner* — Pho M Luu
*Assistant Examiner* — Jerome Leboeuf

(57) ABSTRACT

An apparatus for reducing load in a memory module. In such an apparatus, there is a circuit platform with a plurality of memory chips coupled to the circuit platform. Each memory chip of the plurality of memory chips each has a plurality of memory dies. At least one controller is coupled to the circuit platform and further coupled to the plurality of memory chips for communication with the plurality of memory dies thereof. The at least one controller is for receiving chip select signals to provide a plurality of rank select signals in excess of the chip select signals. The plurality of memory dies are coupled with wire bonds within the plurality of memory chips for a reduced load for coupling the circuit platform for communicating via a memory channel. The load is sufficiently reduced for having at least two instances of the memory module share the memory channel.

17 Claims, 8 Drawing Sheets

(56) References Cited

U.S. PATENT DOCUMENTS

| | | | |
|---|---|---|---|
| 2013/0175699 A1* | 7/2013 | Haba | H01L 24/20 |
| | | | 257/774 |
| 2014/0110832 A1* | 4/2014 | Crisp | H01L 23/5389 |
| | | | 257/696 |
| 2014/0192583 A1* | 7/2014 | Rajan | G11C 7/10 |
| | | | 365/63 |
| 2014/0203457 A1* | 7/2014 | Kim | H01L 25/18 |
| | | | 257/778 |
| 2015/0046612 A1 | 2/2015 | Gupta | |
| 2015/0178204 A1* | 6/2015 | Ray | G11C 5/04 |
| | | | 711/103 |

OTHER PUBLICATIONS

JEDEC Standard, DDR4 SDRAM, Nov. 2013, JEDEC Solid State Technology Association.*

IDT brochure, "IDT Memory Interface Chipsets," Integrated Device Technology, Inc. (IDT), pp. 1-2, c. 2013.

Wang, David, "A Talk on Memory Buffers," Inphi, http://www.cs.utah.edu/thememoryforum/wang.pdf, (internet download—no date).

International Search Report and Written Opinion, dated May 25, 2016 in PCT/US2016/021458, 12 pages.

* cited by examiner

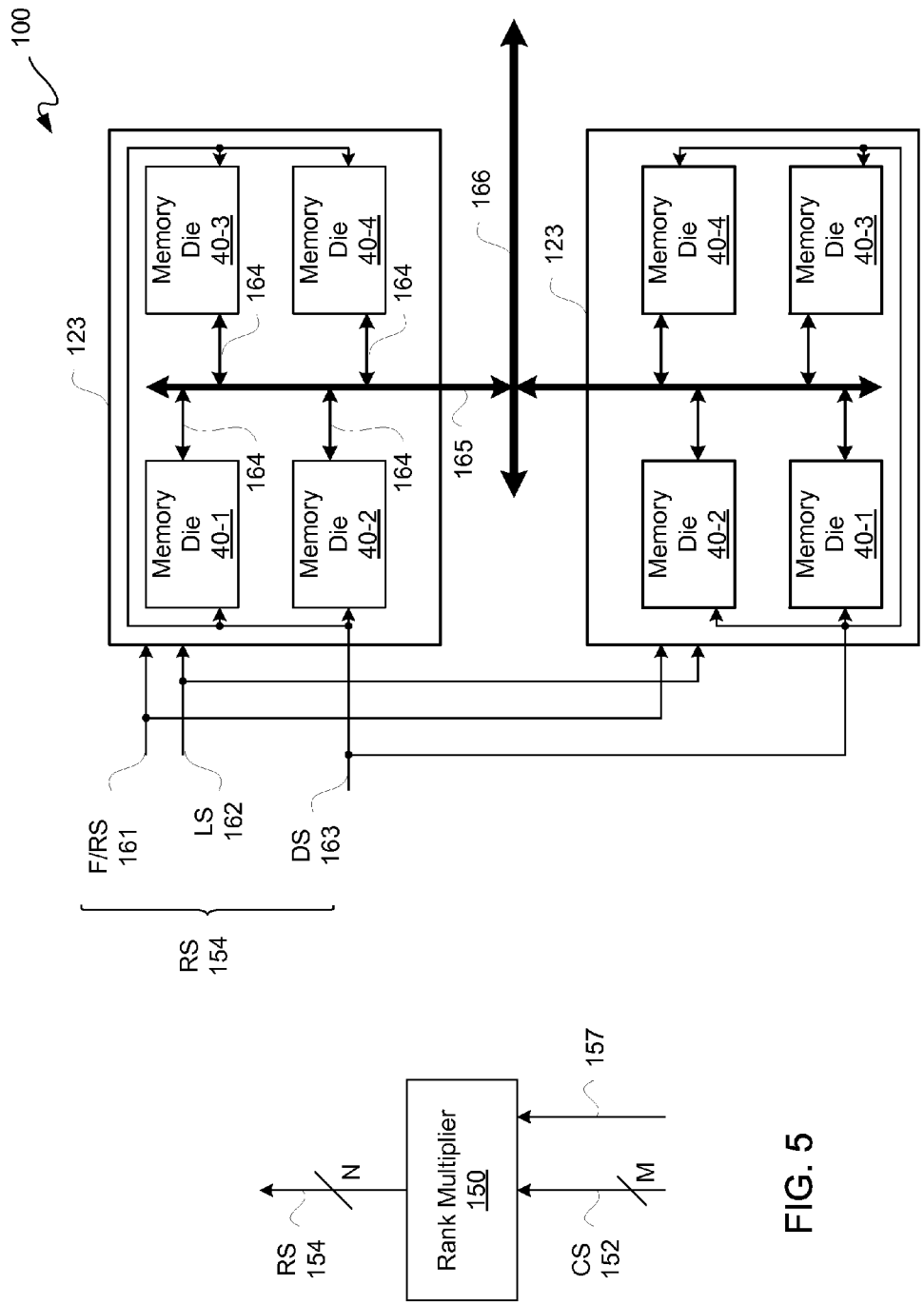

REDUCED LOAD MEMORY MODULE USING WIRE BONDS AND A PLURALITY OF RANK SIGNALS

FIELD

The following description relates to memory modules. More particularly, the following description relates to a reduced load memory module.

BACKGROUND

In the computer industry, on-board memory is conventionally coupled to a processor through a memory channel. Along those lines, a motherboard may have multiple memory slots for multiple memory modules, such as SIMMs or DIMMs, for a channel. More recently, processors are capable of handling more than one memory channel. Some processors are capable of being coupled to two or four memory channels.

One reason for going to multiple channels is to effectively reduce loading effects for operation at higher memory interface speeds. For example, if one DIMM is coupled via one channel, the loading effects may not be appreciably large to prevent higher-stock or over-clocking speeds for operation. However, if a second DIMM is added to that same memory channel in this example, then loading effects caused by addition of such second DIMM can substantially reduce operational speed for communication with such DIMMs. This problem may become worse with each additional memory module added onto a channel. Hence, some processors support multiple channels to reduce the number of DIMMs per channel while allowing for a significant number of DIMMs to increase on-board memory, such as system memory for example. However, adding support for additional channels complicates both processor design and motherboard design.

Others have suggested buffering addresses and data on a memory module to reduce loading effects to provide a load reduced memory module, such as for example LRDMMs. Effectively, buffering transfers loading effects from a channel having multiple memory slots onto each memory module. Some of these buffered memory modules have centrally located buffers similar to registered memory modules, such as for example RDIMMs. In addition to buffering I/O data, these central memory buffers may buffer and retransmit command, address, and clock signals to memory dies of such memory module. Other configurations may have a centrally located registered clock driver ("RCD") with distributed data buffers to provide such data I/O loads more locally to edge connector pads and associated memory dies. These shorter trace lengths may increase data path speed and signal integrity while reducing latency on a memory channel bus. However, buffering not only adds additional circuitry, which may be in the form of additional chips, to a memory module, such buffering may also increase operational latency of a memory module in comparison to an unbuffered memory module, such as a UDIMM for example. Thus, if only one memory module is located on a channel, a load reduced memory module may be slower than a more conventional unbuffered memory module.

Accordingly, it would be desirable and useful to provide a memory module which may be added to a channel that has less impact on performance without substantially increasing cost and/or increasing latency.

BRIEF SUMMARY

An apparatus relates generally to a reduced load memory module. In such an apparatus, there is a circuit platform with a plurality of memory chips coupled to the circuit platform. Each memory chip of the plurality of memory chips each has a plurality of memory dies. At least one controller is coupled to the circuit platform and further coupled to the plurality of memory chips for communication with the plurality of memory dies thereof. The at least one controller is for receiving chip select signals to provide a plurality of rank select signals in excess of the chip select signals. The plurality of memory dies are coupled with wire bonds within the plurality of memory chips for a reduced load for coupling the circuit platform for communicating via a memory channel. The load is sufficiently reduced for having at least two instances of the memory module share the memory channel.

A system relates generally to having reduced load memory modules. In such a system, there is a motherboard having a memory bus for a memory channel. A processor is coupled to the motherboard. A first memory module is coupled to the memory bus for communicating via the memory channel. A second memory module is coupled to the memory bus for communication via the memory channel. Each of the first memory module and the second memory module includes a circuit platform having a plurality of memory chips coupled to the circuit platform. Each memory chip of the plurality of memory chips each has a plurality of memory dies. At least one controller is coupled to the circuit platform and is coupled to the plurality of memory chips for communication with the plurality of memory dies thereof. The at least one controller is for receiving chip select signals via the memory bus communicated to provide a plurality of rank select signals within the memory module in excess of the chip select signals. The plurality of memory dies are coupled with wire bonds within the plurality of memory chips for a reduced load for coupling the circuit platform for communicating via the memory channel. The load is sufficiently reduced for having at least the first memory module and the second memory module share the memory channel.

A method relates generally to a reduced load memory module. In such a method, chip select information and address information is obtained from a memory channel by such a reduced load memory module. The load reduced memory module has a plurality of memory chips. The chip select information and the address information is converted into rank select information to increase granularity of selection to be greater than the chip select information alone.

Other features will be recognized from consideration of the Detailed Description and Claims, which follow.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 2-1 is a block diagram depicting one side of a two-sided exemplary conventional registered memory module, such as a registered dual in-line memory module ("RDIMM").

FIG. 2-2 is a block diagram depicting one side of a two-sided exemplary conventional load reduced DIMM ("LRDIMM").

FIG. 2-3 is a block diagram depicting an exemplary processor-memory system for the RDIMM of FIG. 2-1.

FIG. 2-4 is a block diagram depicting an exemplary processor-memory system for the LRDIMM of FIG. 2-2.

FIG. 3-1 is a block diagram depicting a front side of a two-sided exemplary RDIMM in accordance herewith.

FIG. 3-2 is a block diagram depicting a back side of the two-sided exemplary RDIMM of FIG. 3-1.

FIG. 4 is a block diagram depicting an exemplary controller.

FIG. 5 is a block diagram depicting exemplary interfacing to an exemplary rank multiplier block.

FIG. 6 is a block diagram depicting an exemplary rank selection system for the RDIMM of FIGS. 3-1 and 3-2.

Other features will be recognized from consideration of the Detailed Description and Claims, which follow.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1:
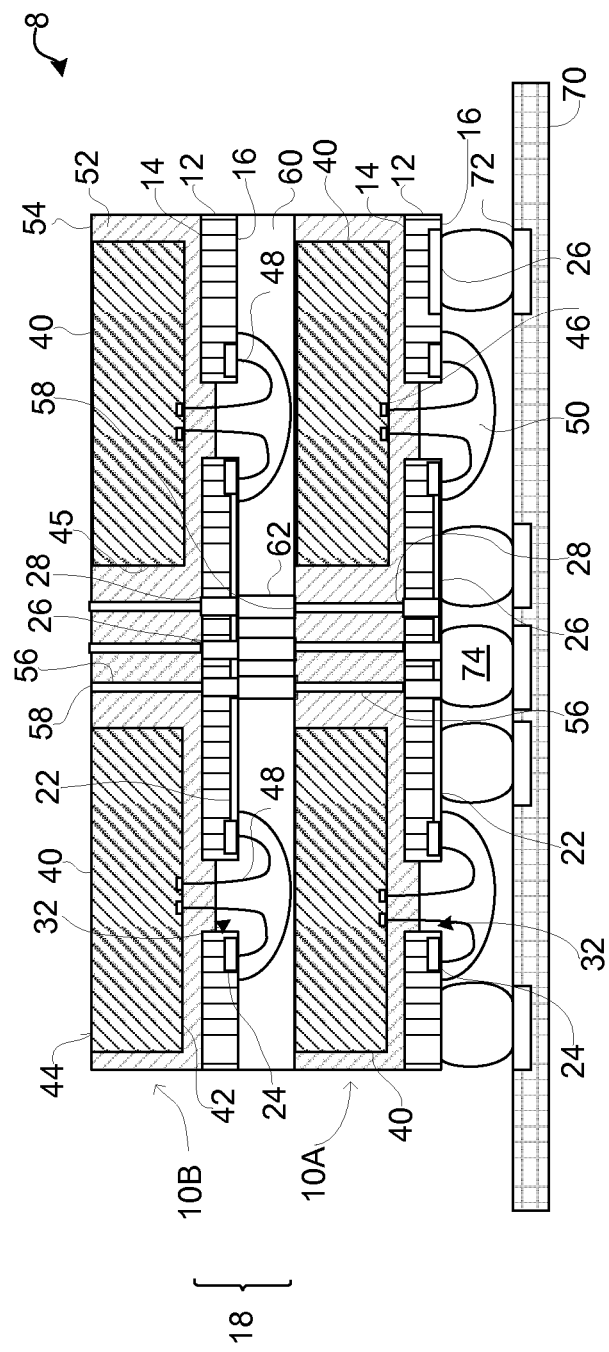
FIG. 1 is a cross-sectional view of an assembly which may include microelectronic packages.

FIG. 1 is a cross-sectional view of an assembly 8. Assembly 8 may include microelectronic packages 10A and 10B. Assembly 8 may be a memory chip 8, and microelectronic packages 10A and 10B may be separated to provide memory chips 8 or may be packaged together as a single memory chip 8. Microelectronic packages 10A and 10B may be coupled to circuit panel 70 using reduced load wiring 46, 56. Additional details regarding assembly 8 and reduced load wiring components 48, 56 thereof may be found in U.S. Pat. No. 8,680,684 B2, which is incorporated by reference herein in its entirety for all purposes.

With continued reference to FIG. 1, microelectronic elements 40, which may be memory dies, may be mounted on respective substrates 12 in a face-down wire bond configuration. In this configuration, microelectronic elements 40, which may be memory dies 40, may be mounted with their front faces 42 facing front face 14 of substrate 12. Element contacts 46 may be exposed at front face of each microelectronic elements 40 and may be electrically connected with wire bonds 48 to substrate wiring 22, that latter of which can include traces or contact pads either formed on or at least partially embedded in substrate 12. Wire bonds 48 passing through windows 32 may provide more direct routing for reduced load wiring.

In the example shown, element contacts 46 are connected to substrate wiring 22 by wire bonds 48 that pass through a window 32 in substrate 12. Although only a pair of wire bonds 48 is shown in FIG. 1, a plurality of wire bond pairs can extend along a row and can pass through a window that is elongated to accept multiple wire bond pairs. An encapsulant 50 can surround and protect wire bonds 48 in the area of window 32 and along portions thereof that extend outside of substrate 12 beyond a back surface 16 thereof.

A molded dielectric layer 52 can at least partially surround microelectronic elements 40 including edges 45 thereof and, in the face-down arrangement of FIG. 1, front face 42. Molded dielectric layer 52 can further bond microelectronic elements 40 to front face 14 of substrate 12. Molded dielectric layer 52 can define a surface 54 that can be substantially flush with back faces 44 of microelectronic elements 40 or can overlie back faces 44 to fully encapsulate microelectronic elements 40.

Substrate wiring 22 can include a plurality of package terminals 26 exposed at the back surface 16 of substrate 12. Package terminals 26 can be electrically connected with either or both microelectronic elements 40 of package 10A or 10B and can further be interconnected with each other. Package terminals 26 can be available for use in connecting package 10A or 10B with a component external to that package 10A, 10B. For example, package terminals 26 in package 10A can be used to connect package 10A with circuit contacts 72 exposed at a surface of a circuit panel 70 that can be a printed circuit board ("PCB") or the like. Package terminals 26 of package 10B illustrate another example, in which package terminals 26 can be used to electrically connect with another package such as package 10A through structures of the package 10A, 10B that are discussed in greater detail below.

Microelectronic elements 40 are arranged along their respective substrates 12 in packages 10A,10B such that they are spaced apart on corresponding first surfaces 14 to define an interconnect area 18 therebetween. In the example shown in FIG. 1, microelectronic elements 40 are arranged such that respective edge surfaces 45 thereof face and are substantially parallel to each other in a spaced-apart manner to define interconnect area 18 therebetween. It is not necessary, however for edge surfaces 45 to be parallel.

In the example shown, interconnect area 18 can be bounded on two sides by edges 45 of microelectronic elements 40 and on the remaining two sides by edges of substrate 12. In other implementations, interconnect area 18 can be considered bounded by an imaginary boundary extending between the outsides of microelectronic elements 40. In implementations with, for example, four microelectronic elements 40, interconnect area 18 can be bounded on four sides by edges 45 of individual microelectronic elements 40. In implementations with more than four microelectronic elements, the interconnect area can be fully enclosed by the microelectronic elements, for example, on as many sides as there are microelectronic elements.

A plurality of stack terminals 28 may be arranged within interconnect area 18 exposed as front surface 14 of substrate 12. The term "exposed at", as used herein does not refer to any specific means of attachment for stack terminals 28 onto substrate 12 or any relative position therebetween. Rather, it indicates that an electrically conductive structure is available for contact with a theoretical point moving in a direction perpendicular to the surface of a dielectric structure toward the surface of such dielectric structure from outside such dielectric structure. Thus, a terminal or other conductive structure which is exposed at a surface of a dielectric structure may project from such surface; may be flush with such surface; or may be recessed relative to such surface and exposed through a hole or depression in the dielectric.

Stack terminals 28 can be an array of individual terminals 28 that can include various rows or columns thereof. Other alternative arrangements of terminals 28 are likewise possible, including those with only two stack terminals 28 or with more than two terminals in various locations selected based on connection with other elements of package 10A or 10B. Stack terminals 28 can be a part of or can otherwise be connected with substrate wiring 22 such that stack terminals 28 can be interconnected with the microelectronic elements 40 of the same package 10A or 10B, with other stack terminals 28 or with package terminals 26.

Stack terminals 28 can be used to connect an associated package 10A or 10B with an external component that overlies front surface 14 of substrate 12. In one example, a plurality of interconnect elements 56 can be connected with stack terminals 28 and extend upwardly therefrom to end surfaces 58 thereof that can be exposed at surface 54 of molded dielectric layer 52.

Interconnects 56, which may be a component of reduced load wiring of assembly 8, can be pins, posts, masses of bond metal or other conductive material, such as may include solder or a metal such as copper, gold, silver, tin, bismuth, indium, aluminum, nickel, etc. In the example shown, interconnects 56 are in the form of pins that extend away from front surface 14 of substrate 12 and extend through molded dielectric layer 52. In such an implementation, end surfaces 58 can form terminals exposed at surface 54 for interconnection with another component. In other implementations, end surfaces 58 can be covered by contacts that are connected therewith to provide a terminal with a larger surface area than that of end surfaces 58 themselves.

As illustratively depicted in FIG. 1, package 10B may be mounted over package 10A, which can be done for example, using adhesive layer 60 that can be formed from a dielectric material such as epoxy or another curable material that can be positioned between surface 54 of package 10A and second surface 16 of substrate 12 of package 10B. Masses of conductive material or a bond metal such as solder or the like, as described above, can connect end surfaces 58 of interconnects 56 of package 10A with package terminals 26 of package 10B. This arrangement, thusly, provides a connection between stack terminals 28 of package 10A with package terminals 26 of package 10B, which can facilitate a number of further connections throughout assembly 8. For example, this arrangement can provide a connection between either or both of microelectronic elements 40 of package 10B with circuit panel 70 and, accordingly, any other components connected therewith. In another example, connections can be provided between either or both of the microelectronic components 40 of package 10B with either or both of the microelectronic components of package 10A. The particular connections facilitated by such a connection can be made by adapting substrate wiring 22 within each package 10A and 10B, including the particular connections made to individual stack terminals 28.

Figures 1, 2:
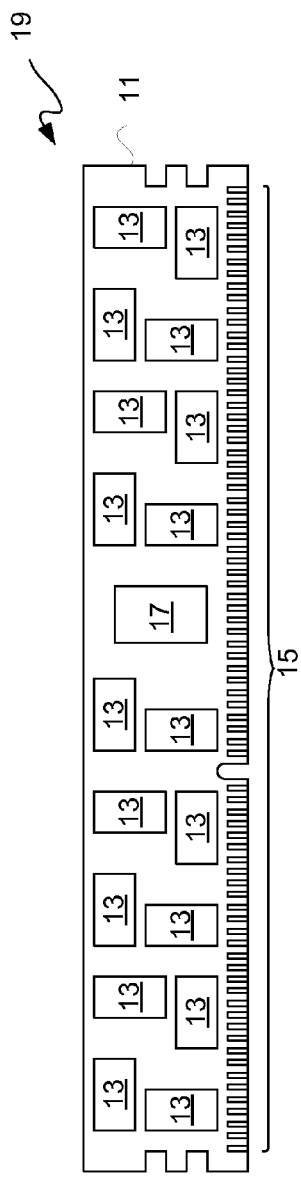
Figure 2:
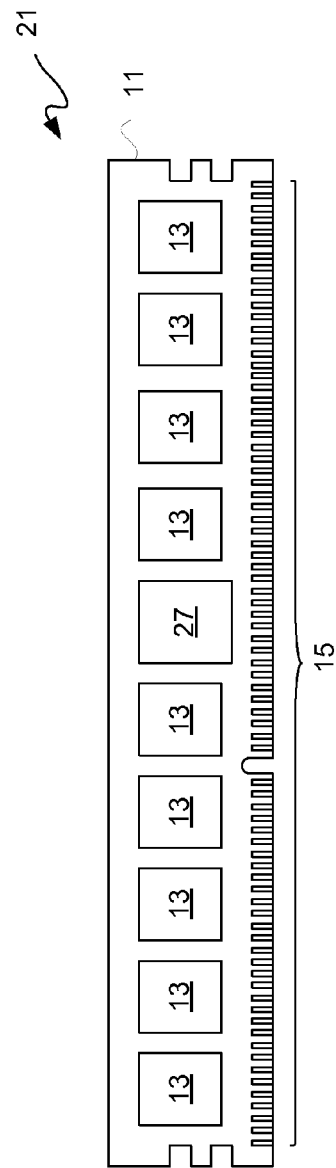

FIG. 2-1 is a block diagram depicting one side of a two-sided exemplary conventional registered memory module 19, such as a registered dual in-line memory module ("RDIMM") 19. RDIMM 19 includes a circuit platform 11, such as a printed circuit board ("PCB") or other circuit platform for example, having pads (i.e., sometimes referred to as "pins" or "gold fingers") 15 and having coupled thereto memory chips 13 and a register clock driver chip ("ROD") 17.

RCD 17 may be coupled for receiving control/command/address/clock ("control") signals from a memory controller via pins 15, such as a separate chip or embedded block in a multi-core processor. Conventionally, RCD 17 is not coupled for receiving and sending data, as sending and receiving data is conventionally directly between memory chips 13 and a memory controller via other pins 15. Generally, control signals are provided to address and control lines or traces on a PCB 11 for example, and these address and control lines conventionally are coupled in parallel to memory chips, such as memory chips 13, for a heavier capacitive loading than data bus lines, as well as for synchronizing or "lining up" data bus signals. Data bus lines conventionally may be provided to only one or two memory chips on an RDIMM for data bus signals, as multiple groups of pins 15 may be used for data busing, with only one grouping of pins 15 used for control signals.

Memory chips 13 are illustratively depicted as being oriented in a "windmill" or "flower" orientation or layout to support memory dies with large aspect ratios. However, a "vertical" orientation or layout may be used to reduce complexity associated with address, command, control, and clock signal routing, namely path length matching.

This buffering of control signals by RCD 17 conventionally adds a clock cycle and uses more power in comparison to conventional unbuffered DIMMs ("UDIMMs"). RDIMMs may be used for higher frequency and higher density memory modules in comparison to UDIMMs. Additionally, two or more RDIMMs may be coupled to a same memory channel for arbitrated sharing of such memory channel for communication with a memory controller. Adding more memory channels may be used to reduce capacitive loading effects; however, this adds additional routing and memory controller complexity. Accordingly, having two or more RDIMMs share a memory channel may avoid having to add additional memory channels.

However, adding more than one RDIMM to a memory channel increases the load on that channel. At higher frequencies, a "loading factor" or "load" on a memory channel may significantly impact performance. In short, each memory chip 13 has some input capacitance, and this input capacitance is more of a signal suppressor at higher frequencies. At frequencies which at too high, signal strength may be suppressed or weakened to an inoperable condition. Furthermore, at higher frequencies, there may be more signal reflection, and accumulated noise due to such signal reflection may reduce signal integrity, namely signal-to-noise ratio, to an inoperable condition.

More recently, load reduced DIMMs ("LRDIMM") have been used. FIG. 2-2 is a block diagram depicting one side of a two-sided exemplary conventional LRDIMM 21. LRDIMM 21 includes a circuit platform 11, such as a PCB or other circuit platform for example, having pins 15 and having coupled thereto memory chips 13 and a buffered register clock driver chip ("BRCD") 27. In this example, memory chips 13 may be multi-die memory chips for increased memory density per memory chip and thus per memory module.

BRCD 27 may include RCD 17 and additionally bi-directional data buffers. Accordingly, control signals and data signals provided to pins 15 from a memory controller may all be provided to BRCD 27 prior to sending to memory chips 13. Likewise, data from memory chips 13 may be provided to BRCD 27 for then sending out to a memory controller via pins 15. Additionally, such LRDIMMs may have multiple ranks, so, for dual die memory chips 13, each memory die thereof may be separately accessed from a common data and control interface. Of course passing data through BRCD 27 may increase data latency. Moreover, adding data buffering to a memory module as in a LRDIMM 21 adds complexity and cost. Rather than a BRCD 27, an RCD 17 with separate data or memory buffers may be used, as described below in additional detail for purposes of clarity and not limitation.

Figures 2, 3:
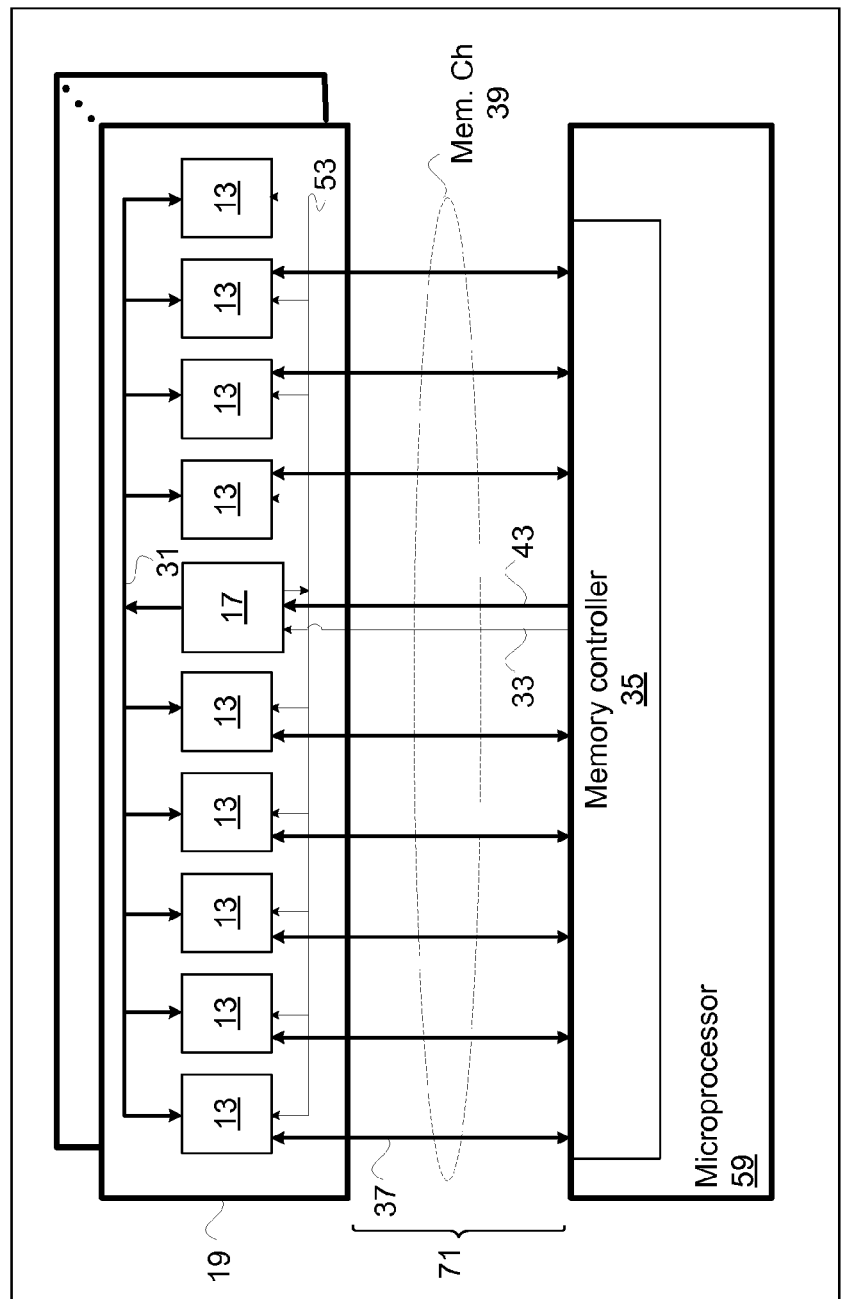

FIG. 2-3 is a block diagram depicting an exemplary processor-memory system 30 for RDIMM 19. Processor-memory system 30 may include a blade server board or motherboard 51 to which one or more RDIMMs 19 and a data processing engine 59 (e.g., a "microprocessor 59") are coupled via one or more memory channels 39.

One or more RDIMMs 19 may be coupled to a same memory channel 39. However, adding more than one RDIMM 19 to a same memory channel 39 may limit performance, as previously described. In this example, bi-directional data buses 37 are respectively coupled to memory chips 13 at one end and respectively coupled to data interfaces (not shown) of a memory controller 35 of a microprocessor 59 at another end of such buses 37. Microprocessor 59 may be a single or multi-core microprocessor.

Microprocessor 59 may include at least one memory controller 35. Along those lines, if a microprocessor 59 supports multiple memory channels 39, such a microprocessor 59 may include a separate memory controller 35 for each memory channel 39.

A clock signal 33 and control/command/address ("C/A") signals 43 may be provided from memory controller 35 to RCD 17. RCD 17 may provide C/A signals 43 to each of memory chips 13 via a C/A bus 31, where such C/A bus 31 is commonly coupled to RCD 17 and each of memory chips 13. RCD 17 may provide a clock signal 33 to each of memory chips 13 via a clock bus 53 commonly coupled to RCD 17 and each of memory chips 13. While latency of an RDIMM 19 may be less than that of a LRDIMM 21 operating at a same frequency, the ability to clock an LRDIMM 21 at a higher frequency than an RDIMM 19 may result in less overall latency.

As is known, one or more RDIMMs 19 may be socketed to a motherboard 51 having coupled thereto a microprocessor 59, such as by LGA for example. Traces for memory channel 39 may be located in motherboard 51, which generally may be considered a memory bus 71. Memory bus 71 may be for a single communications channel, namely memory channel 39, even though such memory bus 71 may be used to support one, two, or more instances of RDIMMs 19.

Figures 2, 3, 4:
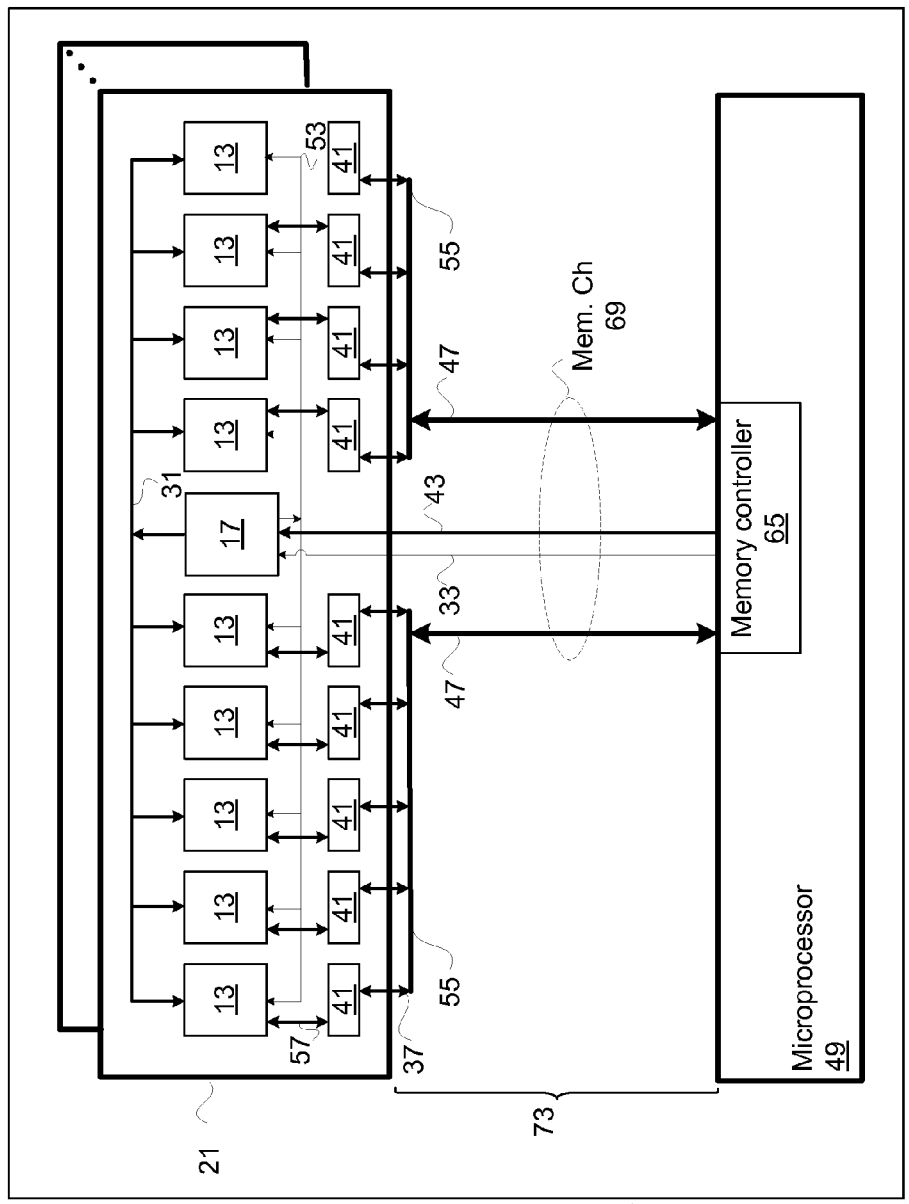
Figures 1, 3:
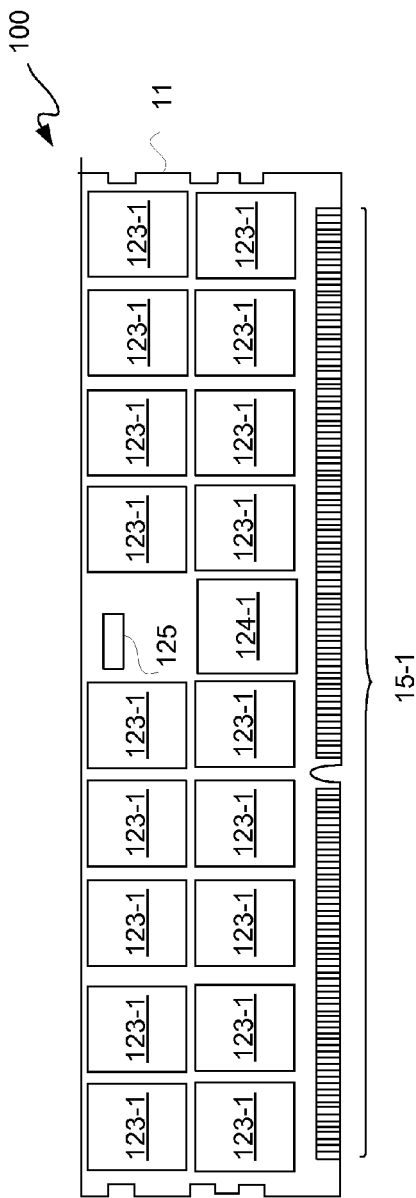
Figures 2, 3:
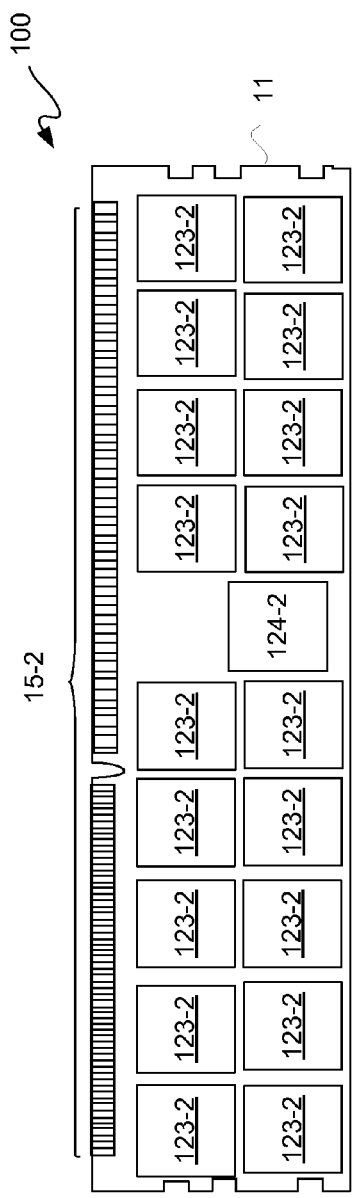
Figure 4:
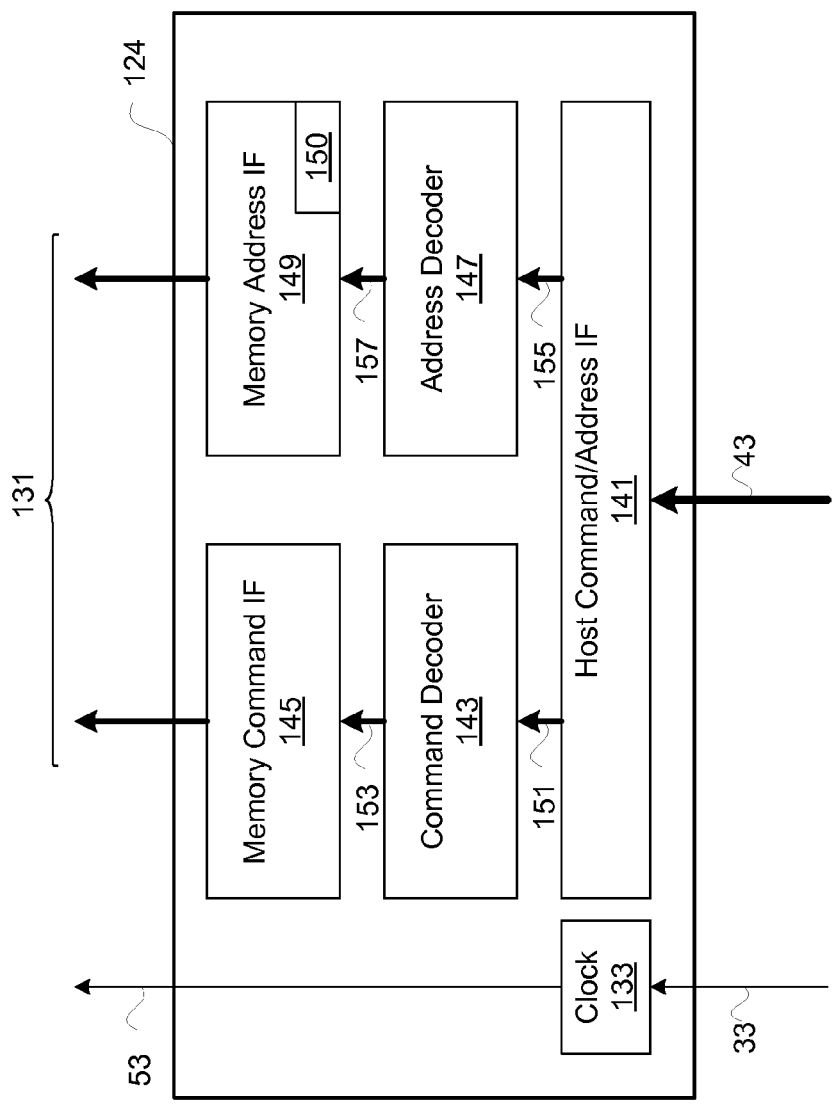

FIG. 2-4 is a block diagram depicting an exemplary processor-memory system 61 for LRDIMM 21. Processor-memory system 61 may include a blade server board or motherboard 51 to which one or more RDIMMs 21 and a data processing engine 49 (e.g., a "microprocessor 49") are coupled via one or more memory channels 69.

One or more LRDIMMs 21 may be coupled to a same memory channel 69. LRDIMMs 21 may be able to share a same memory channel 69 by re-driving data, as well as control signals, locally on a module, and this local re-driving may be used to overcome capacitive loading issues associated with RDIMMs 19 at the expense of additional complexity and power consumption.

In this example of an LRDIMM 21, separate data buffers 41 are used. Though there is a one-to-one correspondence between data buffers 41 and memory chips 13 in this example, in another implementation there may be more memory chips for each data buffer 41. In this example, memory chips 13 have a "vertical" orientation.

Bi-directional data buses 57 are respectively coupled to memory chips 13 at one end and respectively coupled to data or memory buffers 41 at another end. Bi-directional data buses 37 are respectively coupled to data or memory buffers 41 at one end and respectively coupled to a common data bus 55 at another end. This common data bus 55 may be of a memory channel 69 having traces on a motherboard 51, or a daughter card or other system board for example, which traces may generally be considered a memory bus 73. Memory bus 73 may be for a single communications channel, namely memory channel 69, even though such memory bus 73 may be used to support one, two, or more instances of LRDIMMs 21.

A memory controller 65 of microprocessor 49 may be coupled to such common data bus 55 for bidirectional communication of data signals 47, these data signals 47 may include DQs as well as a data strobe signal ("DS"). Accordingly, data may be strobed into or out of such data buffers 41, subject to control of RCD 17. Microprocessor 49 may be a single or multi-core microprocessor.

Microprocessor 49 may include at least one memory controller 65. Along those lines, if a microprocessor 49 supports multiple memory channels 49, such a microprocessor 49 may include a separate memory controller 65 for each memory channel 69.

A clock signal 33 and C/A signals 43 may be provided from memory controller 65 to RCD 17. RCD 17 may provide C/A signals 43 to each of memory chips 13 via a C/A bus 31, where such C/A bus is commonly coupled to RCD 17 and each of memory chips 13. RCD 17 may provide a clock signal 33 to each of memory chips 13 via a clock bus 53 commonly coupled to RCD 17 and each of memory chips 13. In another implementation, C/A bus 31 may be commonly coupled to RCD 17 and each of data buffers 41, or more particularly memory buffers 41, for such other implementation. RCD 17 may provide a clock signal 33 to such data buffers 41, as well as side band information associated with a decoded command. Thus, data buffers 41 may involve training for resolving three-way interface synchronization, namely communicating with a host, memory chips, and an RCD, which may add additional complexity.

In either implementation for having separate data buffers or centralized data buffers, having local data buffers 41 may consume a significant amount of DIMM PCB area and power, which may limit use of such a DIMM to large form factor implementations with sufficient cooling capability.

A single BRCD 27 may involve a complex design, including training for timing and phase adjustments. Though having a single BRCD 27 may be more complex, such an implementation may be more compact than having separate local data buffers 41. However, again in either implementation, more complexity is added as compared with a RDIMM.

While latency of an RDIMM 19 may be less than that of a LRDIMM 21 operating at a same frequency, the ability to clock an LRDIMM at a higher frequency than an RDIMM may result in less overall latency at a cost of more power. Moreover, an LRDIMM may support multiple ranks, such as ranks 0 through 3 for example. Conventionally, a left front side, a left back or reverse side, a right front side, and a right reverse side may be separate ranks. For example, there may be a clock signal path for a left back as rank 1, and a separate clock signal path for a left front as rank 0. However, the number of these ranks may be substantially limited by complexity of an LRDIMM. Along those lines, delays to data buffers 41 from different memory chips, including from different memory dies and/or row locations within memory arrays of memory dies, may be different from one another.

Therefore, to avoid cost and complexity associated with LRDIMMs 21 in a processor-memory system, it may be beneficial to provide RDIMMs capable of sharing a memory channel but with frequency performance at least equal to that of LRDIMMs sharing a memory channel. For purposes of clarity by way of example and not limitation, the following description assumes an "on-DIMM" implementation. However, even though an "on-DIMM" implementation is described, the following description likewise applies to an "on-system-board" implementation.

FIG. 3-1 is a block diagram depicting a front side of a two-sided exemplary RDIMM 100, and FIG. 3-2 is a block diagram depicting a back side of the two-sided exemplary RDIMM 100 of FIG. 3-1. With simultaneous reference to FIGS. 3-1 and 3-2, RDIMM 100 is further described.

RDIMM 100 includes a circuit platform 11, such as a PCB or other circuit platform for example, having front side pins 15-1 and back side pins 15-2 and having coupled to such PCB 11 front side memory chips 123-1, back side memory chips 123-2, a front side rank-multiplier-register-clock-driver chip ("controller") 124-1, and a back side controller 124-2. In this example, two smaller controllers 124-1 and 124-2 are used rather than one larger controller 124 in order to provide a smaller form factor. However, in another implementation, a single controller on a front or reverse side of PCB 11 may be used. Furthermore, using two controllers 124-1 and 124-2 may reduce complexity associated with address, command, control, and clock signal routing, namely path length matching by having separate front and reverse side environments, as described below in additional detail. Additionally, RDIMM 100 may include a serial presence detect and temperature sensor chip 125.

Memory chips 123 may be multi-die memory chips for increased memory density per chip to provide an overall increase in memory density per memory module. Additionally, the number of memory chips 123, as well as the number of memory dies per memory chip, may be increased in comparison to a conventional RDIMM.

Along those lines, memory dies of memory chips 123 may be coupled to PCB 11 with reduced load wiring, such as described with reference to FIG. 1 for example. Along those lines, xFD packaging from Tessera Technologies, Inc. may be used to provide multi-memory die xFD memory chips. Accordingly, RDIMM 100 may be a load reduced memory module in comparison to a comparable conventional RDIMM. However, in an implementation, RDIMM 100, by leveraging such reduced load wiring, may have more memory chips than a conventional RDIMM, and thus RDIMM 100 may have a comparable load to a conventional RDIMM though with more memory chips and thus greater storage capability. Furthermore, loading from such additional memory chips, which may include multi-memory die memory chips, may be reduced with ranks selection, as described below in additional detail, to reduce load of RDIMM 100 to be less than that of a comparable conventional RDIMM.

With renewed reference to FIG. 1, reduced load wiring may be shorter than conventional wiring, and thus there may be less parasitic or load capacitance associated with such wiring. Moreover, reduced load wiring may have less latency due to signal propagation delay and/or capacitive loading. Reduced load wiring may include wire bonds interfacing integrated circuitry of memory dies 40 of a memory chip 123 to underside or front surfaces of such memory dies for coupling to contacts of circuit platform 11 for communication with a memory data bus via a grouping of pads or pins 15.

Use of reduced load wired memory dies 40 in memory chips 123 of an RDIMM 100 means that more RDIMMs 100 may be on a same memory channel than conventional RDIMMs. Furthermore, RDIMMs 100 may have comparable performance with respect to LRDIMMs, though with less complexity.

However, to further reduce a loading factor or load of RDIMMs 100, rank multiplication may be used as described below in additional detail. Currently, the number of chip select signals interfacing to a memory module is limited to a conventional number of memory dies on such a conventional memory module. However, for an RDIMM 100, there may be many more memory dies 40 than in a conventional memory module. This increase in memory dies 40 may substantially increase memory density; however, even though reduced load memory microelectronic packages, such as packages 10A and 10B of FIG. 1 for memory chips 123 for example, may be used, there is some loading thereof.

Rather than accessing all memory dies 40 of a memory chip 123 at a time, rank multiplication may be used to access a subset of such memory dies 40 of a memory chip 123 to further reduce a loading during operation. This may facilitate even further memory density by allowing more memory dies 40 to be implemented in an memory module, such as an RDIMM 100 for example.

Along those lines, FIG. 4 is a block diagram depicting an exemplary controller 124. Controller 124 may include a clock module 133, a host command/address interface ("IF") 141, a command decoder 143, an address decoder 147, a memory command interface 145, and a memory address interface 149.

Clock module 133 may be coupled to receive a clock signal 33 to provide an associated clock signal via clock bus 53. Host command/address interface 141 may be coupled to receive C/A signals 43 via a memory channel, as previously described.

Command information 151 in C/A signals 43 may be provided from host command/address interface 141 to command decoder 143 to provide decoded commands 153 to memory command interface 145. Memory command interface 145 may provide such decoded commands 153, such as read or write commands for example, to C/A bus 131 for memory dies 40 of memory chips 123. C/A bus 131 may bus rank selection signals, described below in additional detail.

Address information 155 in C/A signals 43 may be provided from host command/address interface 141 to address decoder 147 to provide decoded addresses 157 for memory dies 40 of memory chips 123 to memory address interface 149. Memory address interface 149 may provide such decoded addresses 157, such as addresses for page, block, or other reads from or writes to memory arrays of memory dies 40 of memory chips 123, to C/A bus 131 for memory dies 40 of memory chips 123.

Chip select information in C/A signals 43 may be passed up through host command/address interface 141 along with corresponding address information 155 and decoded addresses 157 to memory address interface 149. Chip select information may be used by rank multiplier block 150 of memory address interface 149 to generate rank select signals for providing onto C/A bus 131 for memory dies 40 of memory chips 123.

Along those lines, FIG. 5 is a block diagram depicting exemplary interfacing to an exemplary rank multiplier block 150. A chip select signal ("CS") 152 may be obtained by rank multiplier block 150 from a host device via a memory channel, such as via host command/address interface 141 via C/A bus 43. Chip select signal 152 may be an M-bit signal for M a positive integer greater than one for selecting which of memory chips 123 to activate for then current command and address information. However, there may be a limited number of pins for an RDIMM 100, and so adding additional bits to chip select signal 152 may not be feasible. Additionally, busing signals at high-frequencies over long distances on a motherboard 51 may consume a significant amount of power, so adding signal lines may further be discouraged.

To increase granularity to N-bits, for N a substantially larger integer number than M, address information, such as of decoded addresses 157 or only portions thereof for making selections as described herein for example, may be obtained by rank multiplier block 150 in addition to M-bit chip select signal 152. Rank multiplier block 150 may be configured to use chip select signal 152 and address information, such as from decoded addresses 157, to generate an N-bit rank select signal ("RS") 154, where N-bit rank select signals 154 are in excess of chip select signals 152 for enhanced selection granularity to provide a reduced load. Thus, effectively there are more rank select signals 154 than chip select signals 152. Such N-bits of rank select signal 154 may be parsed to identify at least one memory chip 123 and at least one memory die 40 in such at least one memory chip 123 of a memory module to access. Rank select signals 154 may be bused on a C/A bus 131, to provide an RDIMM 100 which is a multi-level rank registered memory module, such as a bi-rank, quad-rank, or other level-rank RDIMM 100 for example. C/A bus 131 may correspond to C/A bus 31, as previously described, though configured for busing rank select signals 154.

For two or more instances of RDIMMs 100 sharing a same memory channel, such as memory channel 39 for example, there may be a common set of chip select signals 152, as well as a common set of address information and command information for example. Accordingly, such two or more instances of RDIMMs 100 may be operated at the same time for: writing different portions of a data set respectively to such memory module instances for storing such a data set, or reading different portions of a data set respectively from such memory module instances for retrieving such a data set. Along those lines, a first subset of memory chips 123 from each of a first RDIMM 100 and a second RDIMM 100 on a same memory channel 39 may be selected by a third portion of each corresponding set of rank select signals 154, as each set of rank select signals 154 may be generated on each first and second RDIMM 100 from a same set of chip select signals 152 and address information provided via such memory channel 39. Furthermore, a second subset of such first subset of such memory chips 123 of each of such first RDIMM 100 and such second RDIMM 100 on such same memory channel 39 may be selected by a second portion of each such set of rank select signals 154 generated from such a same set of chip select signals 152 as well as corresponding address information. Lastly, a subset of memory dies 40 within such second subset of memory chips 123 of each of such first RDIMM 100 and second RDIMM 100 may be selected using a third portion of such rank select signals 154 respectively generated from such same chip select signals 152 as well as corresponding address information.

Having a finer selection granularity of ranks with rank select signals 154 than provided with only chip selects of chip select signals 152, a reduced load, or more particularly reduced load, RDIMM 100 may be provided as compared with a conventional RDIMM 19 having memory chips with multiple memory dies.

If memory module select signals were used for multiple memory modules on a same channel, then loading effects may be reduced but at the expense of memory bandwidth and additional complexity. Accordingly, memory modules sharing a memory channel conventionally are operated in tandem, including paged or interleaved for example, as is known.

FIG. 6 is a block diagram depicting an exemplary rank selection system for a RDIMM 100. For purposes of clarity by way of example and not limitation, only two front side or reverse side memory chips 123 are illustratively depicted. However, the following description is applicable to more than these example memory chips for a memory module having more than just two memory chips. Additionally, clock bus 53 may be coupled to each of memory dies 40 of a memory chip 123, though not illustratively depicted for purposes of clarity. Moreover, C/A bus 31 may be coupled to each of memory dies 40 of a memory chip 123, though not illustratively depicted for purposes of clarity.

A first portion of an N-bit rank select signal 154 may be used as a first select signal such as between front and reverse side memory chips 123-1 and 123-2 for example, namely front/reverse-side select signal 161. This is a global select with respect to a memory module.

A second portion of N-bit rank select signal 154 may be used as a second select signal to select a subset, namely at least one memory chip, of a set of such globally selected group. For example, such second select signal may be used to select which of either front or reverse side memory chips 123 to access. Accordingly, this second select signal is a local-chip select signal ("LS") 162. A third portion of N-bit rank select signal 154 may be used as a third select signal to select a subset, namely at least one memory die, of a set of memory dies 40 to access, namely die select signal ("DS") 163, of an accessed memory chip 123 as determined by such first and second select signals.

Even though signals 161, 162, and 163 are described herein as single bit signals having either a logic 1 or logic 0 state for corresponding memory chips 123 and memory dies 40 configured for activation responsive to either a logic 1 or logic 0 state, in other implementations one or more of signals 161, 162, and 163 may have more than one bit. Along those lines, multiplexers may be used to further increase selection granularity of one or more of signals 161, 162, and 163. However, scaling upwards for more bits follows from the description herein.

For purposes of clarity by way of example and not limitation, assume that: data is input or output from RDIMM as a 64-bit block and that data bit width of each memory chip 123 is 32-data bits corresponding to data bus width of two 16-bit memory dies 40 thereof; and each memory chip 123 includes four memory dies 40. Thus, in such an example, each of memory chips 123 may include a set of memory dies 40-1 through 40-4. Each of these memory dies 40 may have a die-local data bus 164, and each such die-local data bus 164 may be 16-data bits wide. All four of such die-local data buses 164 may be coupled to a chip-local data bus 165 of a memory chip 123, which is a 32-bit wide data bus. A pair of memory chips 123 may thus have their respective 32-bit wide data buses coupled to a module-local data bus 166, which is a 64-bit wide data bus. In short, memory chip data buses have larger data bus widths than memory die data buses, and a memory module data bus has a larger data bus width than individual memory chip data buses.

For example, after selecting either front or reverse side memory chips 123-1 or 123-2, suppose front side memory chips 123-1 are selected. A selection may be for which two memory chips 123-1 in this example, such as a pair of memory chips 123-1, are to be accessed on RDIMM 100 for each to provide 32-bits of data to a 64-bit data bus 166. Within each of those two memory chips 123-1 to be accessed, a selection may be for which two memory dies 40 in this example are to be accessed for each to provide 16-bits of data to a 32-bit wide data bus 165.

Thus, as in this example, a load of an RDIMM 100 may be reduced by having only a subset of a set of die-local buses 164, as well as corresponding memory dies, active at a time for an accessed memory chip. Furthermore, a load of a RDIMM 100 may be reduced by having only a subset of a set of chip-local buses 165, as well as corresponding memory chips, active at a time for an accessed subset of memory chips of an accessed memory module.

Even though particular bit widths, numbers of memory dies, and numbers of memory chips, including groupings thereof, were described for purposes of clarity by way of example, it should be understood that these or other values may be used in other implementations. For example, 8-bit wide outputs may be obtained from memory dies 40 to form 16-bit wide data buses, and four 16-bit wide data buses may be used to provide a 64-bit wide data bus. Memory dies 40 may be coupled to pads 15, and these pads 15 may be arranged in conformity with a predetermined interface, such as x1, x16, etc. PCIe 2, PCIe 3, etc. interface for example.

Generally, a load of an RDIMM 100 may be sufficiently reduced for having at least two instances of RDIMMs 100 share a same memory channel with performance at least approximate to that of two LRDIMMs. While an implementation of an RDIMM 100 may be a dual-rank module, such as at least 64-bits of data on front and reverse sides, RDIMM 100 may be a quad-rank module, namely at least two 64-bits of data on front and reverse sides. In an implementation, a "load factor" may be 4 or less, namely without data buffers, such as data or memory buffers 41, for buffering data, for supporting at least two instances of RDIMMs 100 on the same memory channel. Furthermore, in an implementation, a load may be sufficiently reduced for supporting a data transfer rate or speed of at least 2400 MT/s (megatransfers per second) with at least two instances of RDIMMs 100 on the same memory channel.

Figure 7:
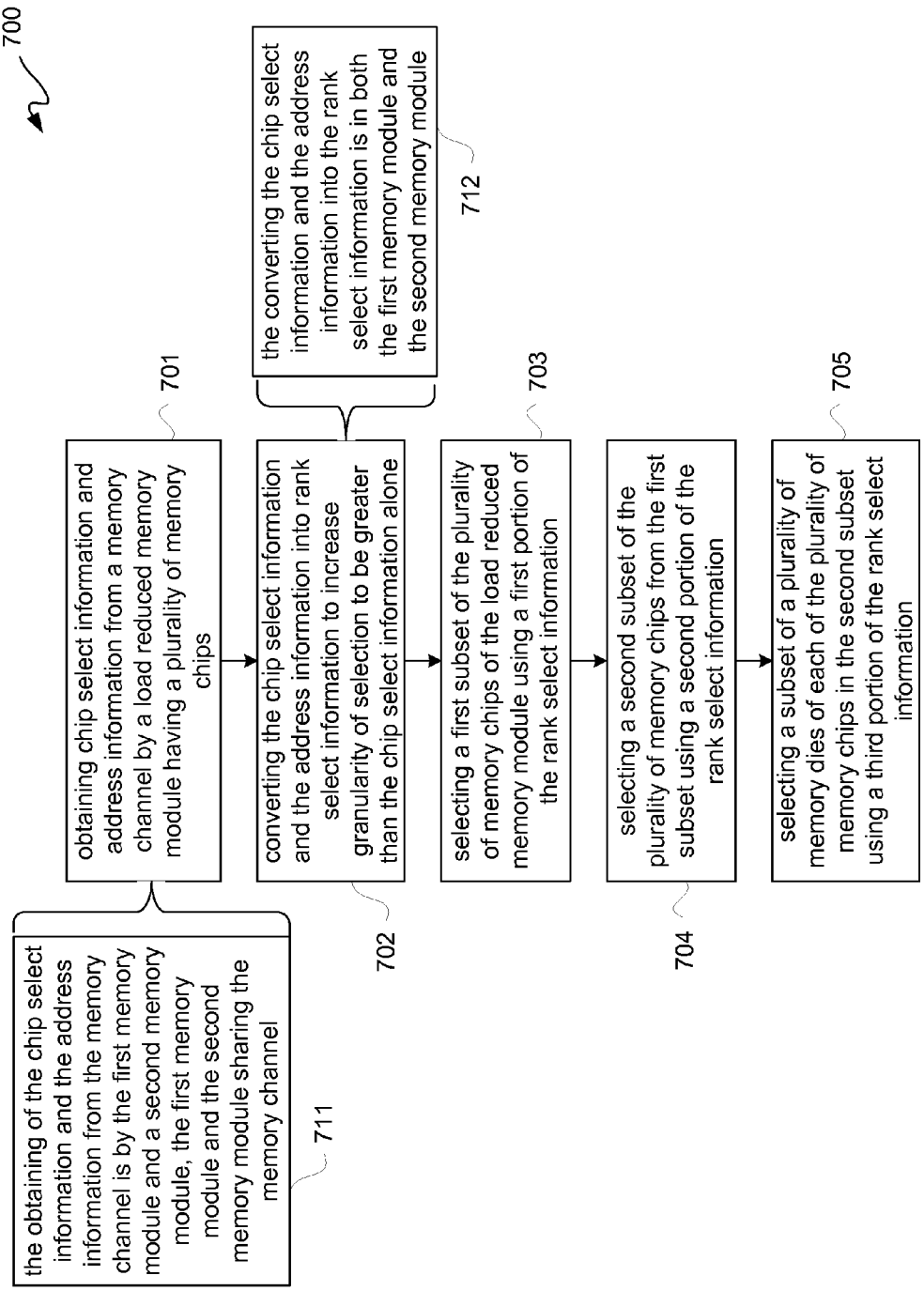
FIG. 7 is a flow diagram depicting an exemplary memory selection flow.

FIG. 7 is a flow diagram depicting an exemplary memory selection flow 700. Memory selection flow 700 is further described with simultaneous reference to FIGS. 1 through 7. At 701, chip select information, such as via chip select signals 152 of C/A signals 43 may be obtained via a memory channel 39, along with corresponding address information 155 via such a memory channel 39, by an RDIMM 100 having a plurality of memory chips. Again, RDIMM 100 is a load reduced RDIMM in comparison to a comparable conventional RDIMM. Moreover, this obtaining at 701 may include at 711 obtaining by both a first RDIMM 100 and a second RDIMM 100 sharing such memory channel 39.

At 702, such chip select information and address information may be converted, such as by rank multiplier block 150, into rank select information, such as provided via rank select signals 154, to increase granularity of selection to be greater than such chip select information alone. In other words, granularity or number of rank select signals 154 is finer or greater, respectively, than granularity or number of chip select signals 152. Moreover, this converting at 702 of chip select information and address information into rank select information may include at 712 obtaining by both a first RDIMM 100 and a second RDIMM 100 sharing such memory channel 39.

At 703, a first subset of memory chips 123 of a memory module, such as one or both of first and second RDIMM 100, may be selected using a first portion of such rank select information, such as via F/R signal 161 for example. At 704, a second subset of such first subset may be selected using a second portion of such rank select information, such as via LS signal 162 for example. At 705, a subset of memory dies 40 of each of such memory chips 123 in such second subset may be selected using a third portion of such rank select information, such as via DS signal 163 for example.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A memory system, comprising:
    a first memory module and a second memory module coupled to a same memory channel for sharing the memory channel;
    each of the first memory module and the second memory module, comprising:
        a circuit platform;
        a plurality of memory chips coupled to the circuit platform;
        wherein each memory chip of the plurality of memory chips has a plurality of memory dies;
        at least one controller coupled to the circuit platform and further coupled to the plurality of memory chips for communication with the plurality of memory dies thereof;
        wherein the at least one controller is for receiving chip select signals to provide a plurality of rank select signals in excess of the chip select signals;
        wherein the plurality of memory dies are coupled with wire bonds within the plurality of memory chips for a reduced load for coupling the circuit platform for communicating via a memory channel; and
        wherein the load is sufficiently reduced for having at least the first memory module and the second memory module share the memory channel;
    wherein a memory chip of the first memory module and a memory chip of the second memory module are commonly coupled to receive an N-bit rank select signal of the plurality of rank select signals for sharing the memory channel;
    wherein a first portion of the N-bit rank select signal is for a front/reverse-side select signal;
    wherein a second portion of the N-bit rank select signal is for a local-chip select signal; and
    wherein a third portion of the N-bit rank select signal is for a die select signal.

2. The memory system according to claim 1, wherein each of the first memory module and the second memory module is a registered dual in-line memory module.

3. The memory system according to claim 1, wherein each of the first memory module and the second memory module is a quad-rank memory module.

4. The memory system according to claim 1, wherein the load without buffering data is for supporting the at least the first memory module and the second memory module on the memory channel.

5. The memory system according to claim 1, wherein the wire bonds within the plurality of memory chips are for interfacing integrated circuitry of the plurality of memory dies coupled to underside surfaces of the plurality of memory dies for coupling to the circuit platform for communication with the memory channel.

6. The memory system according to claim 1, wherein the N-bit rank select signal of the plurality of rank select signals is for selecting:
    a first subset of the plurality of memory chips;
    a second subset of the first subset of the plurality of memory chips; and a subset of the plurality of memory dies within the second subset of the plurality of memory chips.

7. The memory system according to claim 1, wherein the load is for supporting a data transfer rate of at least 2400 megatransfers per second with the at least the first memory module and the second memory module on the memory channel.

8. The memory system according to claim 7, wherein each of the first memory module and the second memory module has a reduced load without data buffers for supporting the at least the first memory module and the second memory module on the memory channel.

9. The memory system according to claim 1, wherein the at least one controller comprises a rank multiplier block coupled for receiving the chip select signals and corresponding address information for providing the plurality of rank select signals.

10. The memory system according to claim 9, wherein the address information comprises at least portions of decoded addresses obtainable via the memory channel.

11. The memory system according to claim 9, wherein:
the plurality of memory dies have corresponding first data buses; and
the plurality of memory chips have corresponding second data buses;
wherein each of the second data buses has a larger data bus width than each of the first data buses.

12. The memory system according to claim 11, wherein each of the first memory module and the second memory module has a data bus having a larger data bus width than each of the second data buses for communicating via the memory channel.

13. A system, comprising:
a motherboard having a memory bus for a memory channel;
a processor coupled to the motherboard;
a first memory module coupled to the memory bus for communicating via the memory channel;
a second memory module coupled to the memory bus for communication via the memory channel;
wherein each of the first memory module and the second memory module comprises:
a circuit platform;
a plurality of memory chips coupled to the circuit platform;
wherein each memory chip of the plurality of memory chips has a plurality of memory dies;
at least one controller coupled to the circuit platform and further coupled to the plurality of memory chips for communication with the plurality of memory dies thereof;
wherein the at least one controller is for receiving chip select signals via the memory bus communicated to provide a plurality of rank select signals within the memory module in excess of the chip select signals;
wherein the plurality of memory dies are coupled with wire bonds within the plurality of memory chips for a reduced load for coupling the circuit platform for communicating via the memory channel; and
wherein the load is sufficiently reduced for having at least the first memory module and the second memory module share the memory channel;
wherein a memory chip of the first memory module and a memory chip of the second memory module are commonly coupled to receive an N-bit rank select signal of the plurality of rank select signals for sharing the memory channel;
wherein a first portion of the N-bit rank select signal is for a front/reverse-side select signal;
wherein a second portion of the N-bit rank select signal is for a local-chip select signal; and
wherein a third portion of the N-bit rank select signal is for a die select signal.

14. The system according to claim 13, wherein each of the first memory module and the second memory module is a registered dual in-line memory module.

15. The system according to claim 13, wherein the load for each of the first memory module and the second memory module without buffering data is for supporting the at least the first memory module and the second memory module on the memory channel.

16. The system according to claim 13, wherein the plurality of rank select signals are for selecting:
a first subset of the plurality of memory chips from each of the first memory module and the second memory module;
a second subset of the first subset of the plurality of memory chips of each of the first memory module and the second memory module; and
a subset of the plurality of memory dies within the second subset of the plurality of memory chips of each of the first memory module and the second memory module.

17. The system according to claim 13, wherein the at least one controller comprises a rank multiplier block coupled for receiving the chip select signals and corresponding address information for providing the rank select signals.

* * * * *